United States Patent
Hwang et al.

(10) Patent No.: US 12,433,138 B2
(45) Date of Patent: Sep. 30, 2025

(54) ORGANIC LIGHT-EMITTING DISPLAY DEVICE AND METHOD FOR MANUFACTURING THE SAME

(71) Applicant: Samsung Display Co., LTD., Yongin-si (KR)

(72) Inventors: Kyu Hwan Hwang, Seongnam-si (KR); Duck Jung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 237 days.

(21) Appl. No.: 17/768,065

(22) PCT Filed: Jun. 17, 2020

(86) PCT No.: PCT/KR2020/007837
§ 371 (c)(1),
(2) Date: Apr. 11, 2022

(87) PCT Pub. No.: WO2021/125468
PCT Pub. Date: Jun. 24, 2021

(65) Prior Publication Data
US 2024/0099099 A1    Mar. 21, 2024

(30) Foreign Application Priority Data

Dec. 20, 2019   (KR) ........................ 10-2019-0172084

(51) Int. Cl.
*H10K 59/80*   (2023.01)
*H10K 59/12*   (2023.01)
*H10K 59/35*   (2023.01)

(52) U.S. Cl.
CPC ....... *H10K 59/876* (2023.02); *H10K 59/1201* (2023.02); *H10K 59/353* (2023.02); *H10K 59/80515* (2023.02); *H10K 59/8051* (2023.02)

(58) Field of Classification Search
None
See application file for complete search history.

(56) References Cited

U.S. PATENT DOCUMENTS 9,006,713 B2 *   4/2015   Park ...................... H10K 50/13
                                                        257/97
9,048,456 B2 *   6/2015   Chang ................... H10K 59/35
(Continued)

FOREIGN PATENT DOCUMENTS

KR   10-2004-0103339   12/2004
KR   10-2010-0071539   6/2010
(Continued)

OTHER PUBLICATIONS

Chinese Office Action dated Jan. 17, 2025, in Chinese Patent Application No. 202080088492.8 [including English Translation].
(Continued)

*Primary Examiner* — Nishath Yasmeen
(74) *Attorney, Agent, or Firm* — Lerner David LLP

(57) ABSTRACT

An organic light-emitting display device includes a first pattern electrode, a second pattern electrode, and a third pattern electrode, each being electrically connected to a driving electrode, an organic light-emitting structure disposed on the first to third pattern electrodes, a common electrode disposed on the organic light-emitting structure, and a resonance-adjusting pattern disposed between the first pattern electrode and the organic light-emitting structure, the resonance-adjusting pattern overlapping a first light-emitting area in a plan view and including a conductive oxide. The organic light-emitting structure includes a hole-transporting layer, a light-emitting layer, and an electron-transporting layer. The light-emitting layer includes a common light-emitting layer continuously extending in the organic
(Continued)

light-emitting structure, and a light-emitting pattern overlapping the third pattern electrode in a plan view.

10 Claims, 8 Drawing Sheets

(56) References Cited

U.S. PATENT DOCUMENTS

| | | | | |
|---|---|---|---|---|
| 9,231,224 | B2* | 1/2016 | Yoon | H10K 50/155 |
| 9,515,127 | B2* | 12/2016 | Pyo | H10K 59/876 |
| 10,269,875 | B2* | 4/2019 | Lee | H10K 59/353 |
| 2011/0240970 | A1* | 10/2011 | Park | H10K 50/18 |
| | | | | 257/89 |
| 2011/0241000 | A1 | 10/2011 | Choi et al. | |
| 2012/0161172 | A1 | 6/2012 | Oyamada et al. | |
| 2014/0027732 | A1* | 1/2014 | Pyo | H10K 50/852 |
| | | | | 257/40 |
| 2014/0191216 | A1* | 7/2014 | Matsumoto | H10K 50/844 |
| | | | | 257/40 |
| 2015/0014661 | A1* | 1/2015 | Joo | H10K 59/805 |
| | | | | 438/35 |
| 2018/0062116 | A1* | 3/2018 | Park | H10K 59/80521 |
| 2019/0123291 | A1 | 4/2019 | Jeon et al. | |
| 2019/0148648 | A1* | 5/2019 | Lee | H10K 59/353 |
| | | | | 257/40 |
| 2019/0148663 | A1* | 5/2019 | Lee | H10K 59/12 |
| | | | | 257/40 |
| 2019/0165054 | A1 | 5/2019 | Kim et al. | |
| 2020/0152711 | A1* | 5/2020 | Liu | H10K 59/80518 |

FOREIGN PATENT DOCUMENTS

| | | |
|---|---|---|
| KR | 10-2011-0109048 | 10/2011 |
| KR | 10-1182442 | 9/2012 |
| KR | 10-2012-0130516 | 12/2012 |
| KR | 10-2014-0013513 | 2/2014 |
| KR | 10-2014-0115688 | 10/2014 |
| KR | 10-2018-0030295 | 3/2018 |
| KR | 10-2018-0052912 | 5/2018 |
| KR | 10-2018-0069367 | 6/2018 |
| KR | 10-2018-0078848 | 7/2018 |
| KR | 10-2019-0044148 | 4/2019 |
| KR | 10-1983229 | 5/2019 |
| KR | 10-2019-0060908 | 6/2019 |

OTHER PUBLICATIONS

International Search Report, with English translation, corresponding to International Application No. PCT/KR2020/007837 dated Sep. 18, 2020.

Written Opinion, with English translation, corresponding to International Application No. PCT/KR2020/007837, dated Sep. 18, 2020.

Korean Office Action, with English Translation, for Korean Patent Application No. 10-2019-0172084, dated Jan. 12, 2024.

Korean Notice of Allowance with English translation for Korean Patent Application No. 10-2019-0172084, dated Sep. 19, 2024.

* cited by examiner

ORGANIC LIGHT-EMITTING DISPLAY DEVICE AND METHOD FOR MANUFACTURING THE SAME

CROSS-REFERENCE TO RELATED APPLICATION(S)

This application is a national entry of International Application No. PCT/KR2020/007837, filed on Jun. 17, 2020, which claims under 35 U.S.C. 119(a) and 365(b) priority to and benefits of Korean Patent Application No. 10-2019-0172084, filed on Dec. 20, 2019 in the Korean Intellectual Property Office, the entire contents of which are herein incorporated by reference.

BACKGROUND

1. Technical Field

The disclosure relates to an organic light-emitting display device and a method for manufacturing the same.

2. Description of the Related Art

An organic light-emitting display device may include an organic light-emitting layer to generate light. An organic light-emitting layer may have different configurations depending on a wavelength (color) of a light to be emitted.

Layers of the organic light-emitting layer may be damaged by an etchant or the like. Thus, deposition using a mask such as a fine metal mask is being used for forming the organic light-emitting layer.

SUMMARY

An aspect of the disclosure is to provide an organic light-emitting display device that may be manufactured using less masks and may have increased degree of freedom for design.

Another aspect of the disclosure is to provide a method for manufacturing the organic light-emitting display device.

The disclosure may, however, be embodied in many different forms and should not be construed as limited to the embodiments set forth herein.

An organic light-emitting display device according to an embodiment may include a first pattern electrode, a second pattern electrode, and a third pattern electrode, each being electrically connected to a driving electrode, an organic light-emitting structure disposed on the first to third pattern electrodes, a common electrode disposed on the organic light-emitting structure, and a resonance-adjusting pattern disposed between the first pattern electrode and the organic light-emitting structure, the resonance-adjusting pattern overlapping a first light-emitting area in a plan view and including a conductive oxide. The organic light-emitting structure may include a hole-transporting layer, a light-emitting layer, and an electron-transporting layer. The light-emitting layer may include a common light-emitting layer continuously extending in the organic light-emitting structure, and a light-emitting pattern overlapping the third pattern electrode.

In an embodiment, the first light-emitting area may emit a first color light, a second light-emitting area overlapping the second pattern electrode in a plan view may emit a second color light, and a third light-emitting area overlapping the light-emitting pattern in a plan view may emit a third color light.

In an embodiment, each of the first to third pattern electrodes may include a reflective layer. A distance between the common electrode and a reflective layer of the first pattern electrode may be equal to or about a resonance thickness of the first color light. A distance between the common electrode and a reflective layer of the second pattern electrode may be equal to or about a resonance thickness of the second color light. A distance between the common electrode and a reflective layer of the third pattern electrode may be equal to or about a resonance thickness of the third color light.

In an embodiment, the first color light may be a red light, the second color light may be a green light, and the third color light may be a blue light.

In an embodiment, the common light-emitting layer may generate a yellow light, and the light-emitting pattern may generate a blue light.

In an embodiment, the common light-emitting layer may include a green dopant and a red dopant.

In an embodiment, the common light-emitting layer may include a yellow dopant.

In an embodiment, the first color light may be a green light, the second color light may be a blue light, and the third color light may be a red light.

In an embodiment, the common light-emitting layer may generate a cyan light, and the light-emitting pattern may generate a red light.

In an embodiment, the light-emitting pattern may be disposed between the common light-emitting layer and the hole-transporting layer.

In an embodiment, the organic light-emitting display device may include a pixel-defining layer having openings overlapping the first to third pattern electrodes in a plan view, and a portion of the resonance-adjusting pattern may be disposed under the pixel-defining layer.

In an embodiment, the organic light-emitting display device may include a pixel-defining layer having openings overlapping the first to third pattern electrodes in a plan view, and a portion of the resonance-adjusting pattern may be disposed on the pixel-defining layer.

In an embodiment, the resonance-adjusting pattern may include at least one of indium tin oxide, indium zinc oxide, zinc tin oxide, indium oxide, zinc oxide, and tin oxide.

A method for manufacturing an organic light-emitting display device according to an embodiment may include forming a first pattern electrode, a second pattern electrode, and a third pattern electrode, each being electrically connected to a driving element, forming a resonance-adjusting pattern including a conductive oxide on the first pattern electrode, forming a hole-transporting layer on the resonance-adjusting pattern and the first to third pattern electrodes, forming a light-emitting pattern overlapping the third pattern electrode on the hole-transporting layer in a plan view, forming a common light-emitting layer on the hole-transporting layer, forming an electron-transporting layer on the common light-emitting layer, and forming a common electrode on the electron-transporting layer.

In an embodiment, each of the first to third pattern electrodes may include a reflective layer, a distance between the common electrode and a reflective layer of the first pattern electrode may be equal to or about a resonance thickness of the first color light, a distance between the common electrode and a reflective layer of the second pattern electrode may be equal to or about a resonance thickness of the second color light, and a distance between the common electrode and a reflective layer of the third pattern electrode may be equal to or about a resonance thickness of the third color light.

In an embodiment, the first color light may be a red light, the second color light may be a green light, and the third color light may be a blue light.

In an embodiment, the common light-emitting layer may include a dopant to generate a yellow light, and the light-emitting pattern may include a dopant to generate a blue light.

In an embodiment, the first color light may be a green light, the second color light may be a blue light, and the third color light may be a red light.

In an embodiment, the common light-emitting layer may include a dopant to generate a cyan light, and the light-emitting pattern may include a dopant to generate a red light.

In an embodiment, the resonance-adjusting pattern may be formed through by a photolithography process.

According to embodiments of the disclosure, masks required for forming an organic light-emitting structure may be reduced. Furthermore, a margin for preventing overlapping of patterns may be minimized thereby increasing an opening ratio, and a light-emitting area having various shapes may be designed.

DETAILED DESCRIPTION OF THE EMBODIMENTS

Figure 1:
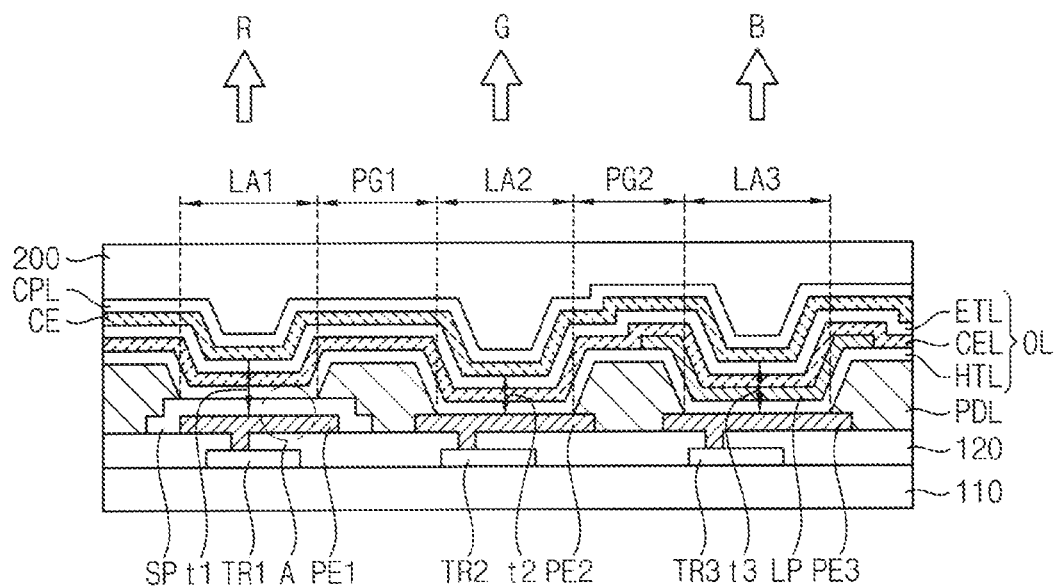
FIG. 1 is a schematic cross-sectional view illustrating an organic light-emitting display device according to an embodiment of the disclosure.

An organic light-emitting display device and a method for manufacturing the same according to embodiments will be described more fully hereinafter with reference to the accompanying drawings, in which some embodiments are shown. In the accompanying drawings, the same or similar reference numerals may be used for the same or similar elements.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
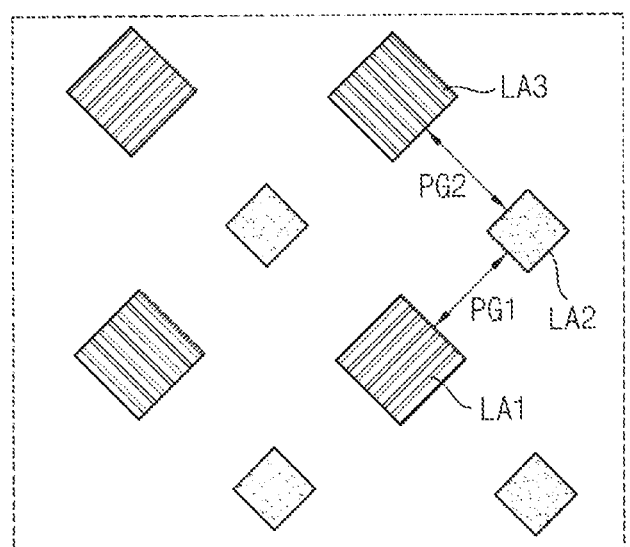
FIG. 2 is a schematic plan view illustrating an organic light-emitting display device according to an embodiment of the disclosure.
Figure 3:
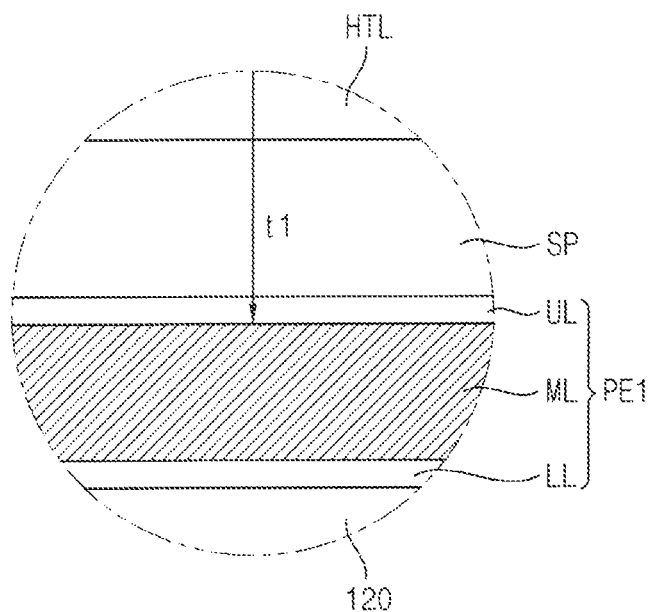
FIG. 3 is an enlarged schematic plan view illustrating region 'A' of FIG. 1

FIG. 1 is a schematic cross-sectional view illustrating an organic light-emitting display device according to an embodiment of the disclosure. FIG. 2 is a schematic plan view illustrating an organic light-emitting display device according to an embodiment of the disclosure. FIGS. 1 and 2 illustrate a display area where a driving element and a light-emitting element may be disposed. FIG. 3 is an enlarged schematic plan view illustrating region 'A' of FIG. 1.

Referring to FIGS. 1 and 2, an organic light-emitting display device may include a display area generating a light to display an image. The display area may include multiple light-emitting areas emitting different color lights. For example, the organic light-emitting display device may include a first light-emitting area LA1 emitting a first color light, a second light-emitting area LA2 emitting a second color light and a third light-emitting area LA3 emitting a third color light. In an embodiment, the first light-emitting area LA1 may emit a red light, the second light-emitting area LA2 may emit a green light, and the third light-emitting area LA3 may emit a blue light.

In an embodiment, the light-emitting areas LA1, LA2, and LA3 may each have a rhombus shape. However, embodiments are not limited thereto. For example, the light-emitting areas LA1, LA2, and LA3 may have different shapes from each other.

Furthermore, the light-emitting areas LA1, LA2, and LA3 may have various shapes such as a square shape, a rectangular shape, a triangular shape, a hexagonal shape, a circular shape, or the like. Furthermore, an edge or a corner of each light-emitting area may have a round shape or may be chamfered.

In an embodiment, the light-emitting areas LA1, LA2, and LA3 may have different sizes from each other. For example, the second light-emitting area LA2 emitting a green light may have a smaller size than the first light-emitting area LA1 emitting a red light and the third light-emitting area LA3 emitting a blue light.

However, embodiments are not limited thereto. For example, the first light-emitting area LA1 or the third light-emitting area LA3 may have a smaller size than other light-emitting areas, or the light-emitting areas LA1, LA2 and LA3 may have a same size.

The organic light-emitting display device may include a light-emitting element and a driving element electrically connected to the light-emitting element. The light-emitting element may generate a light in response to an electric signal or a power, which may be applied thereto. The light generated by the light-emitting element may exit outwardly through the light-emitting area. In an embodiment, the light-emitting element may be an organic light-emitting diode.

The driving element and the light-emitting element may be disposed on a base substrate 110. For example, the driving element may include a first driving element TR1, a second driving element TR2, and a third driving element TR3.

The driving elements TR1, TR2, and TR3 may have configurations the same as or similar to those of various driving elements.

The driving elements TR1, TR2, and TR3 may be covered by an insulation structure 120. The insulation structure 120 may include an inorganic insulation layer, an organic insulation layer, or a combination thereof.

The driving elements TR1, TR2, and TR3 may be electrically connected to corresponding light-emitting elements. For example, a light-emitting element may include an anode, an organic light-emitting structure and a cathode. The light-emitting element may receive a power depending on operation of the driving element thereby generating a light.

In an embodiment, the light-emitting elements may include a pattern electrode electrically connected to the driving elements TR1, TR2, and TR3. For example, the pattern electrode may function as an anode of an organic light-emitting diode.

For example, the organic light-emitting display device may include a first pattern electrode PE1 electrically connected to the first driving element TR1, a second pattern electrode PE2 electrically connected to the second driving element TR2, and a third pattern electrode PE3 electrically connected to the third driving element TR3.

An organic light-emitting structure OL may be disposed on the pattern electrodes PE1, PE2 and PE3. A common electrode CE may be disposed on the organic light-emitting structure OL. The common electrode CE may function as a cathode. The common electrode CE may be referred to as an upper electrode.

A pixel-defining layer PDL may be disposed on the insulation structure 120. The pixel-defining layer PDL may have an opening overlapping the pattern electrodes PE1, PE2 and PE3. The opening may define shapes and sizes of the light-emitting areas LA1, LA2 and LA3.

In an embodiment, the organic light-emitting structure OL may include a hole-transporting layer HTL, a light-emitting layer and an electron-transporting layer ETL. In an embodiment, the light-emitting layer may include a light-emitting pattern LP and a common light-emitting layer CEL. The light-emitting pattern LP may include a dopant different from a dopant of the common light-emitting layer CEL.

In an embodiment, the hole-transporting layer HTL, the common light-emitting layer CEL and the electron-transporting layer ETL may be formed as a common layer that continuously extends in the organic light-emitting structure OL. The light-emitting pattern LP may be formed selectively in a corresponding light-emitting area to have a pattern shape. In an embodiment, the light-emitting pattern LP may overlap the third light-emitting area LA3 and may not overlap the first light-emitting area LA1 and the second light-emitting area LA2. Furthermore, the light-emitting pattern LP may be disposed between the common light-emitting layer CEL and the hole-transporting layer HTL.

For example, the organic light-emitting structure OL in the first light-emitting area LA1 may include the hole-transporting layer HTL, the common light-emitting layer CEL and the electron-transporting layer ETL. The organic light-emitting structure OL in the second light-emitting area LA2 may include the hole-transporting layer HTL, the common light-emitting layer CEL and the electron-transporting layer ETL. The organic light-emitting structure OL in the third light-emitting area LA3 may include the hole-transporting layer HTL, the light-emitting pattern LP, the common light-emitting layer CEL, and the electron-transporting layer ETL.

In an embodiment, the common light-emitting layer CEL may generate a yellow light. For example, the yellow light may have a first peak corresponding to a green light and a second peak corresponding to a red light. In another embodiment, the yellow light may have a spectrum with a broad profile having a maximum intensity in a yellow region.

A thickness of the organic light-emitting structure OL may be determined depending on a resonance thickness of lights emitted by the light-emitting areas. The resonance thickness may be defined by a thickness of a layer, which may induce a resonance effect of a light. A light generated by the organic light-emitting structure OL may resonate between electrodes including a material with a high reflectivity. For example, the light generated by the organic light-emitting structure OL may resonate between the pattern electrodes PE1, PE2 and PE3 and the common electrode CE.

A resonance thickness changes depending on a wavelength of a light. Thus, if a distance between the pattern electrodes PE1, PE2 and PE3 and the common electrode CE is equal to or about a resonance thickness of a light emitted by each light-emitting areas, a light with a specific wavelength may selectively exit from the light-emitting areas, or an intensity of the light may be increased.

For example, thicknesses of the hole-transporting layer HTL, the common light-emitting layer CEL, and the electron-transporting layer ETL may be adjusted such that summation of the thicknesses of the hole-transporting layer HTL, the common light-emitting layer CEL, and the electron-transporting layer ETL may be the same as a resonance thickness t2 of a green light emitted from the second light-emitting area LA2. Thus, even if the organic light-emitting structure OL generates a yellow light in the second light-emitting area LA2, a green light may be emitted from the second light-emitting area LA2 by a resonance effect.

A resonance-adjusting pattern SP may be disposed in the first light-emitting area LA1 between the organic light-emitting structure OL and the first pattern electrode PE1. The resonance-adjusting pattern SP may include a transparent conductive material. Thus, even if a thickness of the organic light-emitting structure OL in the first light-emitting area LA1 is different from a resonance thickness t1 of a red light emitted from the first light-emitting area LA1, a thickness of the resonance-adjusting pattern SP may be adjusted such that a distance between the common electrode CE and the first pattern electrode PE1 corresponds to a resonance thickness t1 of a red light. Thus, even if the organic light-emitting structure OL generates a yellow light in the first light-emitting area LA1, a red light may be emitted from the first light-emitting area LA1 by a resonance effect.

For example, the resonance-adjusting pattern SP may include a metal oxide such as indium tin oxide, indium zinc oxide, zinc tin oxide, indium oxide, zinc oxide, tin oxide, or the like, or a combination thereof.

For example, a portion of the resonance-adjusting pattern SP may be disposed under the pixel-defining layer PDL. Furthermore, the resonance-adjusting pattern SP may cover a side surface of the first pattern electrode PE1.

The light-emitting pattern LP may be disposed in the third light-emitting area LA3. Thus, even if the thicknesses of the hole-transporting layer HTL, the common light-emitting layer CEL, and the electron-transporting layer ETL are determined depending on the resonance thickness t2 of the green light emitted from the second light-emitting area LA2, a thickness of the light-emitting pattern LP may be adjusted such that a distance between the common electrode CE and the third pattern electrode PE3 corresponds to a resonance thickness t3 of a blue light. Thus, even if the organic light-emitting structure OL includes the common light-emitting layer CEL generating a yellow light in the third light-emitting area LA3, a blue light may be selectively emitted from the third light-emitting area LA3.

In an embodiment, the light-emitting pattern LP may be disposed between the hole-transporting layer HTL and the common light-emitting layer CEL. Combination of a hole and an electron may appear mostly at an interface of a light-emitting layer and a hole-transporting layer. Thus, such configuration may increase a blue light and minimize a yellow light in the third light-emitting area LA3.

A resonance thickness may change depending on a resonance type as well as a wavelength of a light. In an embodiment, a thickness of the organic light-emitting structure OL in the second light-emitting area LA2 may be determined to be equal to or about a primary resonance thickness of a green light, and a thickness of the organic light-emitting structure OL in the third light-emitting area LA3 may be determined to be equal to or about a secondary resonance thickness of a blue light.

In an embodiment, the pattern electrodes PE1, PE2 and PE3 may have a multi-layered structure including a transparent conductive material and a metal with a high reflectivity. For example, as illustrated in FIG. 3, the pattern electrodes PE1, PE2 and PE3 may each include a reflective layer MIL, including a metal such as silver (Ag) or the like, and an upper transmitting conductive layer UL disposed on the reflective layer MIL, and including a transparent conductive material. Furthermore, a lower transmitting conductive layer LL may be disposed under the reflective layer MIL. In such configuration, a thickness of the organic light-emitting structure OL may be determined such that a distance between the common electrode CE and the reflective layer MvLv may be equal to or about the resonance thicknesses for the light emitted from each light-emitting areas.

A capping layer CPL may be disposed on the common electrode CE. The capping layer CPL may protect the light-emitting element and may increase an extraction efficiency of the light generated by the organic light-emitting diode.

An encapsulation layer 200 may be disposed on the capping layer CPL. For example, the encapsulation layer 200 may have a stacked structure of an organic thin film and an inorganic thin film.

According to an embodiment of the disclosure, the organic light-emitting structure OL may include one light-emitting pattern LP, and other organic layers may be formed as a common layer. Thus, masks required for forming the organic light-emitting structure OL may be reduced.

Furthermore, in case that a pattern of an organic light-emitting structure is disposed for each of the light-emitting areas LA1, LA2 and LA3, maintaining a proper pixel distance PG1 and PG2 in an approximate range may be required to prevent overlapping of patterns due to errors or misalignment in manufacturing processes. However, according to embodiments of the disclosure, patterns may not be overlapped. Thus, a pixel distance may be minimized thereby increasing an opening ratio. Furthermore, light-emitting areas may be variously designed.

FIGS. 4 to 9 are schematic cross-sectional views illustrating a method for manufacturing an organic light-emitting display device according to an embodiment of the disclosure.

Figure 4:
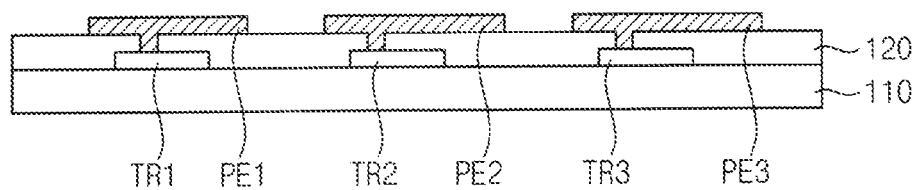
FIGS. 4 to 9 are schematic cross-sectional views illustrating a method for manufacturing an organic light-emitting display device according to an embodiment of the disclosure.

Referring to FIG. 4, driving elements TR1, TR2 and TR3 may be formed on a base substrate 110. The driving elements TR1, TR2 and TR3 may be covered by an insulation structure 120.

Thereafter, pattern electrodes PE1, PE2 and PE3 may be formed to be electrically connected to the driving elements TR1, TR2 and TR3. For example, a first pattern electrode PE1 may be electrically connected to a first driving element TR1, a second pattern electrode PE2 may be electrically connected to a second driving element TR2, and a third pattern electrode PE3 may be electrically connected to a third driving element TR3.

For example, the base substrate 110 may include glass, quartz, sapphire, a polymeric material, or the like, or a combination thereof.

In an embodiment, the driving elements TR1, TR2 and TR3 may include at least one thin film transistor. For example, the driving elements TR1, TR2 and TR3 may include multiple thin film transistors.

For example, a channel layer of the thin film transistor may include amorphous silicon, multi-crystalline silicon (polysilicon), a metal oxide, or a combination thereof. For example, the metal oxide a binary compound ($ABx$), a ternary compound ($ABxCy$) or a quaternary compound ($ABxCyDz$), which may include indium (In), zinc (Zn), gallium (Ga), tin (Sn), titanium (Ti), aluminum (Al), hafnium (Hf), zirconium (Zr), magnesium (Mg), or the like, or a combination thereof. For example, the metal oxide may include zinc oxide ($ZnOx$), gallium oxide ($GaOx$), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like, or a combination thereof.

The insulation structure 120 may include an inorganic insulation layer, an organic insulation layer, or a combination thereof. For example, the inorganic insulation layer may include silicon oxide, silicon nitride, silicon oxynitride, or a combination thereof and may include an insulating metal oxide such as aluminum oxide, tantalum oxide, hafnium oxide, zirconium oxide, titanium oxide, or the like, or a combination thereof. For example, the organic insulation layer may include an organic insulation material such as a phenol resin, an acryl resin, a polyimide resin, a polyamide resin, a siloxane resin, an epoxy resin, or the like, or a combination thereof.

For example, after an insulation structure 120 having contact holes may be formed, a conductive layer may be formed on the insulation structure 120. The conductive layer may be patterned through a process such as photolithography to form the pattern electrodes PE1, PE2 and PE3.

The conductive layer may include a metal, a metal alloy, a metal oxide, or a combination thereof. For example, the conductive layer may have a multi-layered structure including a metal oxide layer including indium tin oxide, indium zinc oxide, zinc tin oxide, indium oxide, zinc oxide, tin oxide, or the like, or a combination thereof, and a metal layer including gold (Au), silver (Ag), aluminum (Al), copper (Cu), nickel (Ni), platinum (Pt), magnesium (Mg), chromium (Cr), tungsten (W), molybdenum (Mo), titanium (Ti), or the like, or a combination thereof.

For example, the pattern electrodes PE1, PE2 and PE3 may include a reflective layer including gold (Au), silver (Ag), aluminum (Al), copper (Cu), nickel (Ni), platinum (Pt), magnesium (Mg), chromium (Cr), tungsten (W), molybdenum (Mo), titanium (Ti), or the like, or a combination thereof, an upper transmitting conductive layer disposed on the reflective layer and including a transparent metal oxide and a lower transmitting conductive layer disposed under the reflective layer and including a transparent metal oxide.

Figure 5:
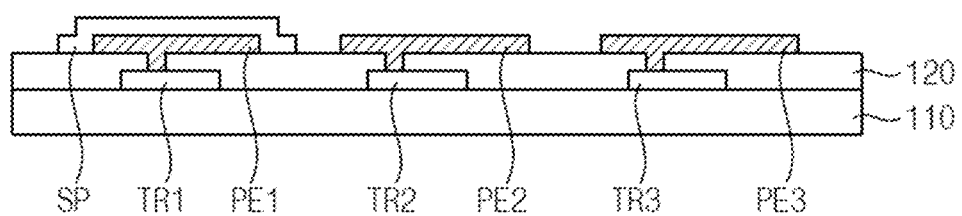

Referring to FIG. 5, a resonance-adjusting pattern SP may be formed on the first pattern electrode PE1.

The resonance-adjusting pattern SP may include a transparent conductive material. For example, the resonance-adjusting pattern SP may include indium tin oxide, indium zinc oxide, zinc tin oxide, indium oxide, zinc oxide, tin oxide, or a combination thereof.

Figure 6:
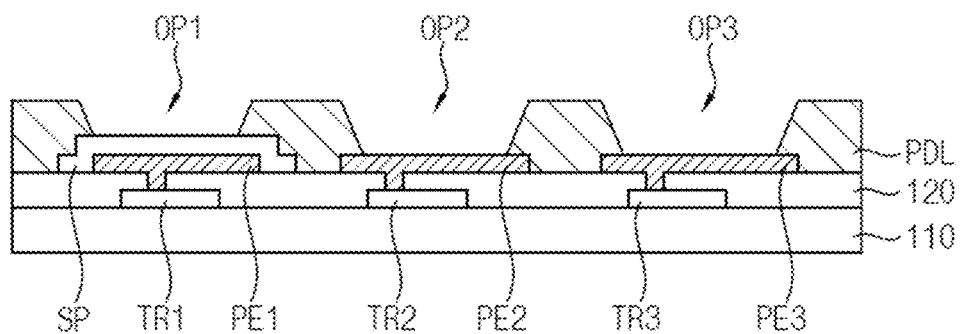

Referring to FIG. 6, a pixel-defining layer PDL may be formed on the insulation structure 120. The pixel-defining layer PDL may have openings OP1, OP2 and OP3 exposing at least a portion of upper surfaces of the resonance-adjusting pattern SP, the second pattern electrode PE2 and the third pattern electrode PE3.

For example, a photoresist composition including a phenol resin, an acryl resin, a polyimide resin, a polyamide resin, a siloxane resin, an epoxy resin or the like may be coated on the insulation structure 120, exposed to a light and developed to form the pixel-defining layer PDL having the openings OP1, OP2 and OP3.

Figure 7:
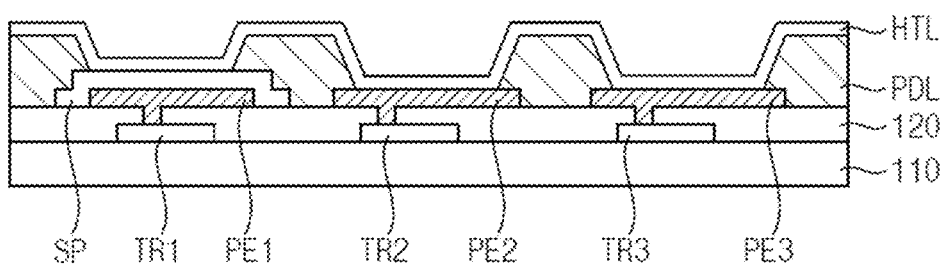

Referring to FIG. 7, a hole-transporting layer HTL may be formed. The hole-transporting layer HTL may be formed as a common layer disposed on the pixel-defining layer PDL, the resonance-adjusting pattern SP, the second pattern electrode PE2 and the third pattern electrode PE3.

The hole-transporting layer HTL may have various configurations. For example, the hole-transporting layer HTL may include various hole-transporting materials, hole-injecting materials or a combination thereof.

For example, the hole-transporting layer HTL may include a hole-transporting region and a hole-injecting region. The hole-injecting region may be disposed between the hole-transporting region and the pattern electrodes PE1, PE2 and PE3.

The hole-transporting region may include a hole-transporting material. For example, the hole-injecting region may include at least one of a carbazole derivative such as N-phenylcarbazole, polyvinylcarbazole or the like, a fluorene derivative, a triphenylamine derivative such as TPD (N,N'-bis(3-methylphenyl)-N,N'-diphenyl-[1,1-biphenyl]-4,4'-diamine), TCTA (4,4',4"-tris(N-carbazolyl)triphenylamine) or the like, NPB (N,N'-di(1-naphthyl)-N,N'-diphenylbenzidine), TAPC (4,4'-cyclohexylidene bis[N,N-bis(4-methylphenyl)benzenamine]) or the like.

The hole-injecting region may include a hole-injecting material. For example, the hole-injecting region may include a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine), TDATA (4,4'4"-tris(N,N-diphenylamino)triphenylamine), 2TNATA (4,4',4"-tris{N-(2-naphthyl)-N-phenylamino}-triphenylamine), HATCN (1,4,5,8,9,11-hexaazatriphenylene hexacarbonitrile), PEDOT/PSS (Poly(3,4-ethylenedioxythiophene)/Poly(4-styrenesulfonate)), PANI/DBSA (Polyaniline/Dodecylbenzenesulfonic acid), PANI/CSA (Polyaniline/Camphor sulfonic acid), PANI/PSS ((Polyaniline)/Poly(4-styrenesulfonate)) or the like, or a combination thereof.

For example, the hole-injecting region may further include a charge-generating material. For example, the charge-generating material may be p-dopant. For example, the p-dopant may be a quinone derivative such as TCNQ (tetracyanoquinodimethane) or F4-TCNQ (2,3,5,6-tetrafluoro-tetracyanoquinodimethane), a metal oxide such as tungsten oxide or molybdenum oxide, or the like, or a combination thereof.

The hole-transporting layer HTL may further include a hole buffer region, an electron-blocking region or the like, as desired.

Figure 8:
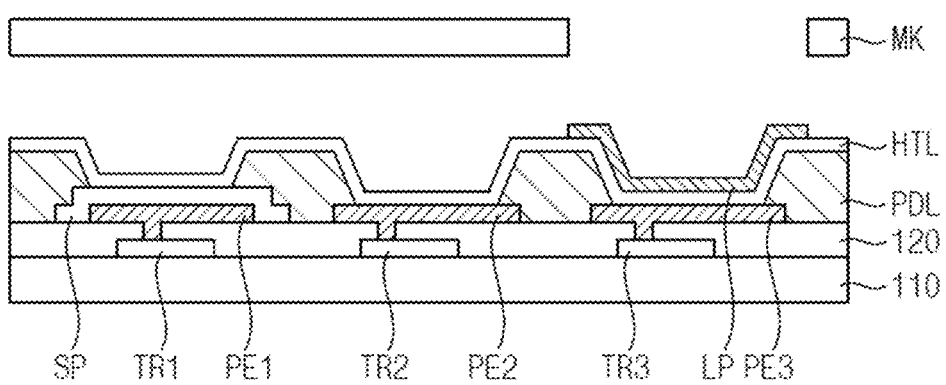

Referring to FIG. 8, a light-emitting pattern LP may be formed on the hole-transporting layer HTL overlapping the third pattern electrode PE3.

For example, a mask MK having an opening may be disposed above the hole-transporting layer HTL, and a light-emitting material may be deposited thereon through the opening to form the light-emitting pattern LP. For example, the mask MK may be a fine metal mask.

In an embodiment, the light-emitting pattern LP may include a host and a blue dopant.

For example, the host may include Alq3 (tris(8-hydroxyquinolino)aluminum), CBP (4,4'-bis(N-carbazolyl)-1,1'-biphenyl), PVK (poly(n-vinylcabazole), AND (9,10-di(naphthalene-2-yl)anthracene), TCTA (4,4',4"-Tris(carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2'-dimethyl-biphenyl), MADN (2-methyl-9,10-bis(naphthalen-2-yl)anthracene), DPEPO (bis[2-(diphenylphosphino)phenyl]ether oxide), CP1 (hexaphenyl cyclotriphosphazene), UGH2 (1,4-bis(triphenylsilyl)benzene), DPSiO3 (hexaphenylcyclotrisiloxane), DPSiO4 (octaphenylcyclotetra siloxane), PPF (2,8-Bis(diphenylphosphoryl)dibenzofuran), or the like, or a combination thereof.

For example, the blue dopant may include (4,6-F2ppy) 2Irpic or the like.

Figure 9:
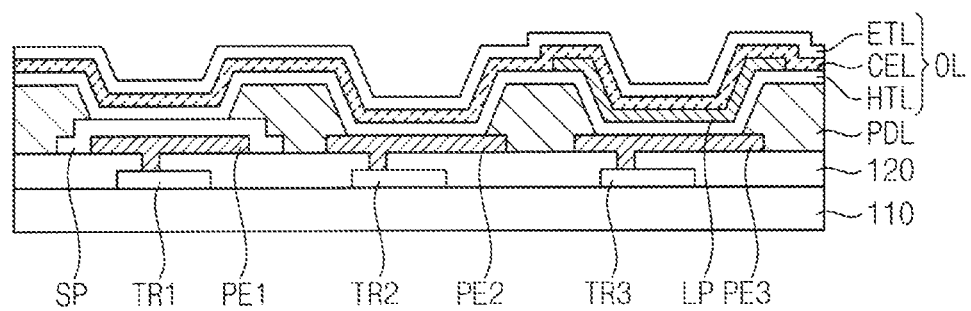

Referring to FIG. 9, a common light-emitting layer CEL may be formed on the hole-transporting layer HTL and the light-emitting pattern LP, and an electron-transporting layer ETL may be formed on the common light-emitting layer CEL.

In an embodiment, the common light-emitting layer CEL may include a host and a dopant for generating a yellow light. For example, the common light-emitting layer CEL may include a red dopant and a green dopant.

For example, the red dopant may include PtOEP (Pt(II) octaethylporphine), Ir(piq)3 (tris(2-phenylisoquinoline) iridium), Btp2Ir(acac) (bis(2-(2'-benzothienyl)-pyridinato-N,C3')iridium(acetylacetonate), or the like, or a combination thereof.

For example, the green dopant may include Ir(ppy)3 (tris(2-phenylpyridine) iridium), Ir(ppy)2(acac) (bis(2-phenylpyridine)(Acetylacetonato)iridium(III)), Ir(mppy)3 (tris (2-(4-tolyl)phenylpiridine)iridium), C545T (10-(2-benzothiazolyl)-1,1,7,7-tetramethyl-2,3,6,7-tetrahydro-1H,5H,11H-[1]benzopyrano [6,7,8-ij]-quinolizin-11-one), or the like, or a combination thereof.

In an embodiment, the common light-emitting layer CEL may include a yellow dopant.

The electron-transporting layer ETL may have various configurations. For example, the electron-transporting layer ETL may include various electron-transporting materials, electron-injecting materials, or a combination thereof.

For example, the electron-transporting layer ETL may include an electron-transporting region and an electron-injecting region. The electron-injecting region may be disposed between the electron-transporting region and a common electrode CE formed on the electron-transporting layer ETL.

The electron-transporting region may include Alq3 (tris (8-hydroxyquinolinato)aluminum), TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato) aluminum), Bebq2 (berylliumbis(benzoquinolin-10-olate)), ADN (9,10-di(naphthalene-2-yl)anthracene), or the like, or a combination thereof.

For example, the electron-injecting region may include LiF, LiQ (Lithium quinolate), Li2O, BaO, NaCl, CsF, lanthanoid such as Yb, metal halide such as RbCl or RbI, or the like, or a combination thereof.

Thereafter, as illustrated in FIG. 1, the common electrode CE may be formed on the electron-transporting layer ETL, a capping layer CPL may be formed on the common electrode CE, and an encapsulation layer 200 may be formed on the capping layer CPL.

The common electrode CE may include a metal, a metal oxide, a metal fluoride, or a combination thereof. For example, the common electrode CE may include lithium (Li), calcium (Ca), silver (Ag), aluminum (Al), magnesium (Mg), indium tin oxide, indium zinc oxide, zinc tin oxide, indium oxide, zinc oxide, tin oxide, or the like, or a combination thereof. In an embodiment, the common electrode CE may include silver-magnesium alloy.

The capping layer CPL may include an inorganic material and/or an organic material. For example, the inorganic material may include zinc oxide, tantalum oxide, zirconium oxide, titanium oxide, or the like, or a combination thereof. The organic material may include poly(3,4-ethylenedioxythiophene) (PEDOT), 4,4'-bis[N-(3-methylphenyl-N-phenyl amino)]biphenyl (TPD), 4,4',4"-tris[(3-methylphenyl)phenyl amino]triphenylamine (m-MTDATA), 1,3,5-tris[N,N-bis(2-methylphenyl-amino]-benzene (o-MTDAB), 1,3,5-tris [N,N-bis(3-methylphenyl-amino]-benzene (m-MTDAB) or the like.

The encapsulation layer 200 may include a stacked structure of an organic thin film and an inorganic thin film. For example, the encapsulation layer 200 may include two inorganic thin films and an organic thin film disposed therebetween. However, embodiments are not limited thereto. The encapsulation layer 200 may have a structure including at least two organic thin films and at least three inorganic thin films.

For example, the organic thin film may include a cured polymer such as polyacrylate or the like. For example, the cured polymer may be formed from cross-linking reaction of monomers. For example, the inorganic thin films may include silicon oxide, silicon nitride, silicon carbide, aluminum oxide, tantalum oxide, hafnium oxide, zirconium oxide, titanium oxide, or the like, or a combination thereof.

According to embodiments, masks required for forming an organic light-emitting structure may be reduced. Furthermore, a margin for preventing overlapping of patterns may be minimized thereby increasing an opening ratio, and a light-emitting area having various shapes may be designed.

Figure 10:
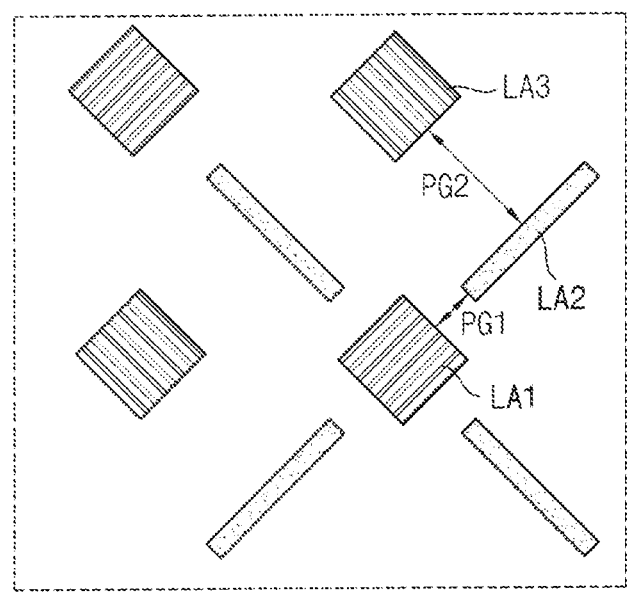
FIGS. 10 to 12 are schematic plan views illustrating an organic light-emitting display device according to an embodiment of the disclosure.
Figure 11:
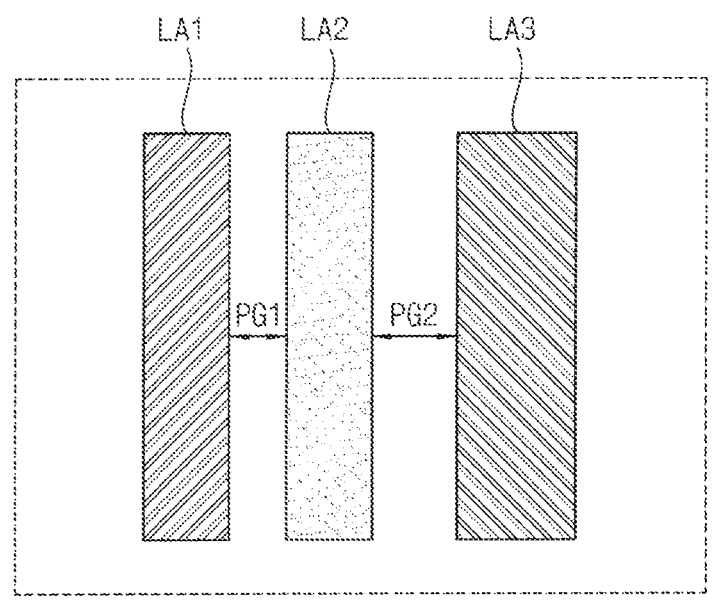
Figure 12:
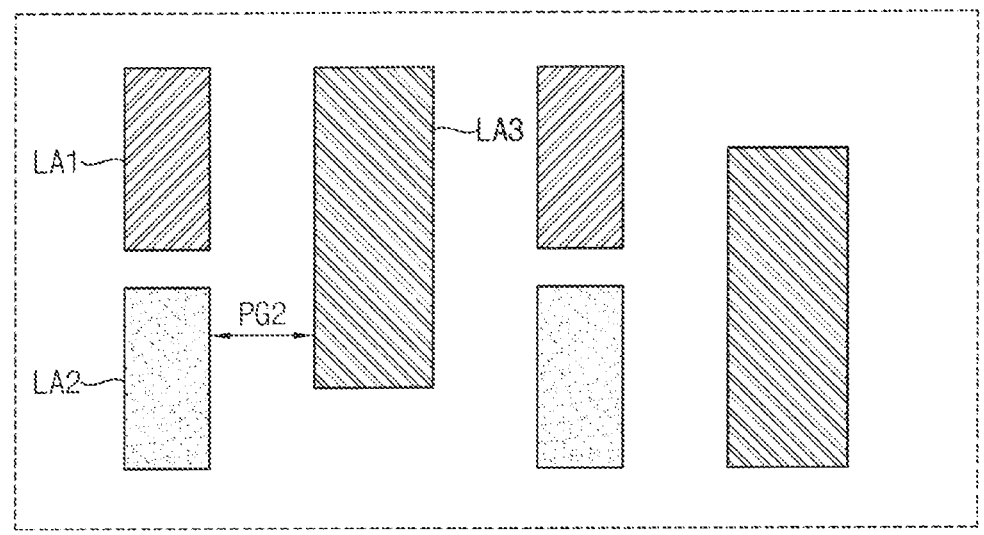

FIGS. 10 to 12 are schematic plan views illustrating an organic light-emitting display device according to an embodiment of the disclosure.

Referring to FIG. 10, an organic light-emitting display device may include a first light-emitting area LA1 emitting a first color light, a second light-emitting area LA2 emitting a second color light and a third light-emitting area LA3 emitting a third color light. In an embodiment, the first light-emitting area LA1 may emit a red light, the second light-emitting area LA2 may emit a green light, and the third light-emitting area LA3 may emit a blue light.

In an embodiment, the first and third light-emitting areas LA1 and LA3 may each have a rhombus shape, and the second light-emitting area LA2 may have a rectangular shape. For example, a first pixel distance PG1 between the first light-emitting area LA1 and the second light-emitting area LA2 may be less than a second pixel distance PG2 between the second light-emitting area LA2 and the third light-emitting area LA3. For example, a ratio of the first pixel distance PG1 to the second pixel distance PG2 may be about 1:2 to about 1:10.

Referring to FIG. 11, a first light-emitting area LA1, a second light-emitting area LA2 and a third light-emitting area LA3 may have a rectangular shape. In an embodiment, the first light-emitting area LA1, the second light-emitting area LA2 and the third light-emitting area LA3 may be arranged along a direction.

Referring to FIG. 12, a first light-emitting area LA1, a second light-emitting area LA2 and a third light-emitting area LA3 may have a rectangular shape. The first light-emitting area LA1 may be spaced apart from the second light-emitting area LA2 along a first direction. The third light-emitting area LA3 may be spaced apart from the first light-emitting area LA1 and the second light-emitting area LA2 along a second direction perpendicular to the first direction.

Figure 13:
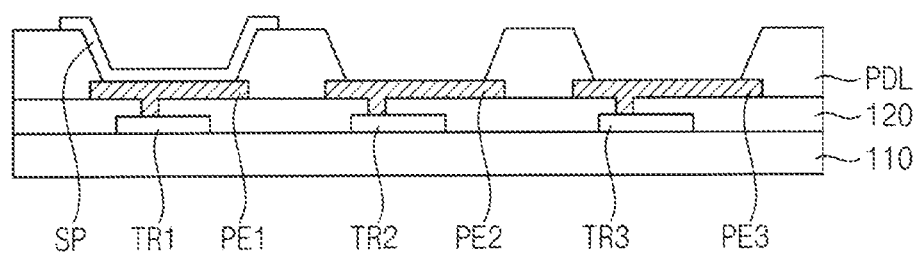
FIGS. 13 and 14 are schematic cross-sectional views illustrating a method for manufacturing an organic light-emitting display device according to an embodiment of the disclosure.
Figure 14:
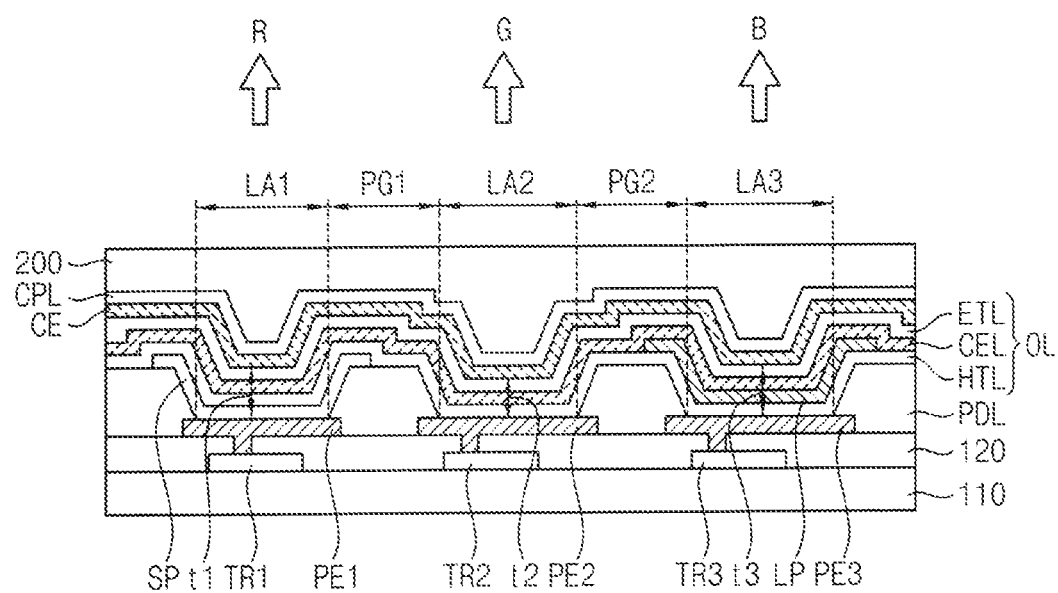

FIGS. 13 and 14 are schematic cross-sectional views illustrating a method for manufacturing an organic light-emitting display device according to an embodiment of the disclosure.

Referring to FIGS. 13 and 14, a resonance-adjusting pattern SP may be formed after a pixel-defining layer PDL may be formed. For example, a portion of the resonance-adjusting pattern SP may be disposed on an upper surface of the pixel-defining layer PDL.

The resonance-adjusting pattern SP may be formed through a photolithography process. However, embodiments are not limited thereto, and the resonance-adjusting pattern SP may be formed using a fine metal mask.

An organic light-emitting structure OL, a common electrode CE, a capping layer CPL and an encapsulation layer 200, which may be formed on the resonance-adjusting pattern SP, may have the same configurations as those explained previously in the above.

Figure 15:
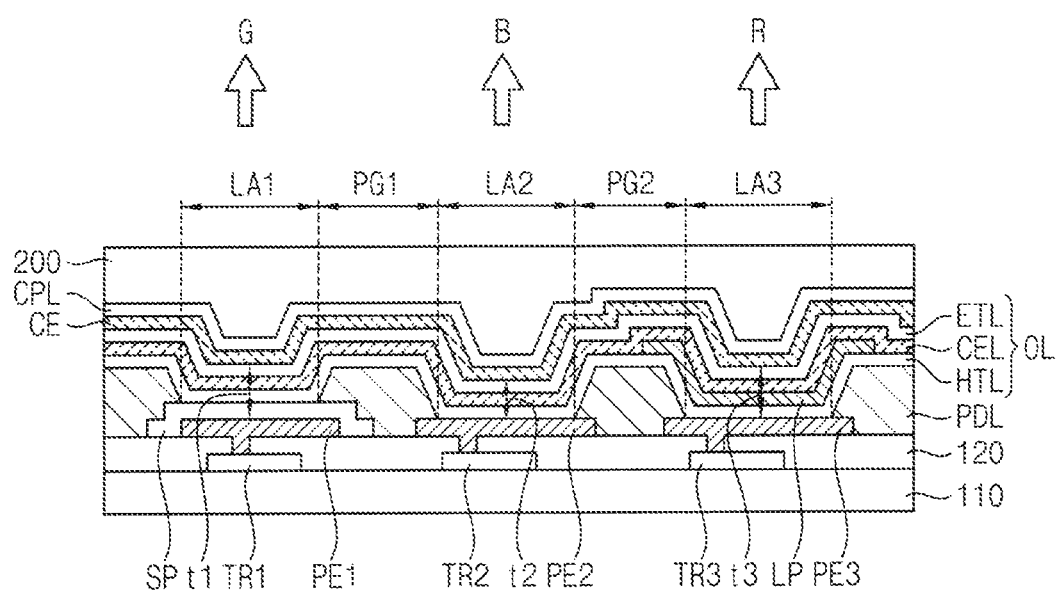
FIG. 15 is a schematic cross-sectional view illustrating an organic light-emitting display device according to an embodiment of the disclosure.

FIG. 15 is a schematic cross-sectional view illustrating an organic light-emitting display device according to an embodiment of the disclosure.

Referring to FIG. 15, an organic light-emitting display device may include a first light-emitting area LA1 emitting a first color light, a second light-emitting area LA2 emitting a second color light, and a third light-emitting area LA3 emitting a third color light. In an embodiment, the first light-emitting area LA1 may emit a green light, the second light-emitting area LA2 may emit a blue light, and the third light-emitting area LA3 may emit a red light.

The organic light-emitting display device may include driving elements TR1, TR2 and TR3, pattern electrode PE1, PE2 and PE3 electrically connected to the driving elements TR1, TR2 and TR3, an organic light-emitting structure OL disposed on the pattern electrode PE1, PE2 and PE3 and a common electrode CE disposed on the organic light-emitting structure OL.

The organic light-emitting structure OL may include a hole-transporting layer HTL, a light-emitting layer and an electron-transporting layer ETL. In an embodiment, the light-emitting layer may include a light-emitting pattern LP and a common light-emitting layer CEL.

In an embodiment, the hole-transporting layer HTL, the common light-emitting layer CEL and the electron-transporting layer ETL may be formed as a common layer that continuously extends in a display area. The light-emitting pattern LP may be formed selectively in a corresponding light-emitting area to have a pattern shape. In an embodiment, the light-emitting pattern LP may overlap the third light-emitting area LA3 emitting a red light, and may not overlap the first light-emitting area LA1 and the second light-emitting area LA2.

For example, the organic light-emitting structure OL in the first light-emitting area LA1 may include the hole-transporting layer HTL, the common light-emitting layer CEL and the electron-transporting layer ETL. The organic light-emitting structure OL in the second light-emitting area LA2 may include the hole-transporting layer HTL, the common light-emitting layer CEL and the electron-transporting layer ETL. The organic light-emitting structure OL in the third light-emitting area LA3 may include the hole-transporting layer HTL, the light-emitting pattern LP, the common light-emitting layer CEL and the electron-transporting layer ETL.

In an embodiment, the common light-emitting layer CEL may generate a cyan light. For example, the cyan light may have a first peak corresponding to a green light and a second peak corresponding to a blue light. In another embodiment, the cyan light may have a spectrum with a broad profile having a maximum intensity in a cyan region. The light-emitting pattern LP may generate a red light. For example, the common light-emitting layer CEL may include a host, a blue dopant and a green dopant, and the light-emitting pattern LP may include a host and a red dopant.

A thickness of the organic light-emitting structure OL may be determined depending on a resonance thickness of lights emitted by the light-emitting areas.

For example, thicknesses of the hole-transporting layer HTL, the common light-emitting layer CEL and the electron-transporting layer ETL may be adjusted such that summation of thicknesses of the hole-transporting layer HTL, the common light-emitting layer CEL and the electron-transporting layer ETL (if the pattern electrodes include an upper transmitting conductive layer, the summation may further include a thickness of the upper transmitting conductive layer) may be the same as a resonance thickness $t2$ of a blue light emitted from the second light-emitting area LA2. Thus, even if the organic light-emitting structure OL generates a cyan light in the second light-emitting area LA2, a blue light may be emitted from the second light-emitting area LA2 by a resonance effect.

A resonance-adjusting pattern SP may be disposed in the first light-emitting area LA1 between the organic light-emitting structure OL and the first pattern electrode PE1. The resonance-adjusting pattern SP may include a transparent conductive material. A thickness of the resonance-adjusting pattern SP may be adjusted such that a distance between the common electrode CE and the first pattern electrode PE1 or between the common electrode CE and a reflective layer of the first pattern electrode PE1 corresponds to a resonance thickness $t1$ of a green light. Thus, even if the organic light-emitting structure OL generates a cyan light in the first light-emitting area LA1, a green light may be emitted from the first light-emitting area LA1 by a resonance effect.

The light-emitting pattern LP may be disposed in the third light-emitting area LA3. A thickness of the light-emitting pattern LP may be adjusted such that a distance between the common electrode CE and the third pattern electrode PE3 or between the common electrode CE and a reflective layer of the third pattern electrode PE3 corresponds to a resonance thickness $t3$ of a red light. Thus, even if the organic light-emitting structure OL includes the common light-emitting layer CEL generating a cyan light in the third light-emitting area LA3, a red light may be selectively emitted from the third light-emitting area LA3.

As explained above, the disclosure may include various embodiments in which dispositions and configurations of a resonance-adjusting pattern, a light-emitting pattern and a common light-emitting layer may be varied.

The disclosure may be applied to various display devices. For example, the disclosure may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure.

What is claimed is:

1. An organic light-emitting display device, comprising:
a substrate;
a first pattern electrode, a second pattern electrode, and a third pattern electrode disposed on a surface of the substrate, each of the first pattern electrode, the second pattern electrode, and the third pattern electrode being electrically connected to a corresponding driving electrode;
an organic light-emitting structure disposed on the first to third pattern electrodes;
a common electrode disposed on the organic light-emitting structure;
a pixel-defining layer having openings respectively overlapping the first to third pattern electrodes in a direction perpendicular to the surface; and
a resonance-adjusting pattern disposed between the first pattern electrode and the organic light-emitting structure, the resonance-adjusting pattern overlapping a first light-emitting area in the direction and including a conductive oxide, a portion of the resonance-adjusting pattern being disposed under the pixel-defining layer, wherein
the organic light-emitting structure includes:
a hole-transporting layer;
a light-emitting layer; and
an electron-transporting layer, and
the light-emitting layer includes:
a common light-emitting layer continuously extending in the organic light-emitting structure such that the common light-emitting layer respectively overlaps each of the first pattern electrode, the second pattern electrode, and the third pattern electrode in the direction; and
a light-emitting pattern overlapping the third pattern electrode in the direction,
the first light-emitting area emits a first color light,
a second light-emitting area overlapping the second pattern electrode in the direction emits a second color light,
a third light-emitting area overlapping the light-emitting pattern in the direction emits a third color light, and
a light generated by the common light-emitting layer includes the first color light and the second color light.

2. The organic light-emitting display device of claim 1, wherein:
each of the first to third pattern electrodes includes a reflective layer;
a distance in the direction between the common electrode and the reflective layer of the first pattern electrode is equal to or about a resonance thickness of the first color light;
a distance in the direction between the common electrode and the reflective layer of the second pattern electrode is equal to or about a resonance thickness of the second color light; and
a distance in the direction between the common electrode and the reflective layer of the third pattern electrode is equal to or about a resonance thickness of the third color light.

3. The organic light-emitting display device of claim 1, wherein:
the first color light is a red light;
the second color light is a green light; and
the third color light is a blue light.

4. The organic light-emitting display device of claim 3, wherein:
the common light-emitting layer generates a yellow light; and
the light-emitting pattern generates a blue light.

5. The organic light-emitting display device of claim 4, wherein the common light-emitting layer includes a green dopant and a red dopant.

6. The organic light-emitting display device of claim 4, wherein the common light-emitting layer includes a yellow dopant.

7. The organic light-emitting display device of claim 1, wherein:
the first color light is a green light;
the second color light is a blue light; and
the third color light is a red light.

8. The organic light-emitting display device of claim 7, wherein:
the common light-emitting layer generates a cyan light; and
the light-emitting pattern generates a red light.

9. The organic light-emitting display device of claim 1, wherein the light-emitting pattern is disposed between the common light-emitting layer and the hole-transporting layer.

10. The organic light-emitting display device of claim 1, wherein the resonance-adjusting pattern includes at least one of indium tin oxide, indium zinc oxide, zinc tin oxide, indium oxide, zinc oxide, and tin oxide.

* * * * *